(12) United States Patent
Schmitt

(10) Patent No.: US 8,680,856 B2
(45) Date of Patent: Mar. 25, 2014

(54) ARRANGEMENT FOR THE POTENTIAL-FREE MEASUREMENT OF CURRENTS

(75) Inventor: Jochen Schmitt, Biedenkopf (DE)

(73) Assignee: Sensitec GmbH, Lahnau (DE)

( * ) Notice: Subject to any disclaimer, the term of this patent is extended or adjusted under 35 U.S.C. 154(b) by 743 days.

(21) Appl. No.: 12/735,206

(22) PCT Filed: Dec. 18, 2008

(86) PCT No.: PCT/EP2008/010833
§ 371 (c)(1),
(2), (4) Date: Jun. 21, 2010

(87) PCT Pub. No.: WO2009/080286
PCT Pub. Date: Jul. 2, 2009

(65) Prior Publication Data
US 2010/0264905 A1    Oct. 21, 2010

(30) Foreign Application Priority Data
Dec. 22, 2007    (DE) .................. 10 2007 062 633

(51) Int. Cl.
*G01R 33/02*    (2006.01)
*G01R 15/20*    (2006.01)

(52) U.S. Cl.
USPC ....................... 324/252; 324/117 R

(58) Field of Classification Search
USPC ........... 324/117 R, 117 H, 126–127, 250–254
See application file for complete search history.

(56) References Cited

U.S. PATENT DOCUMENTS

| | | | | |
|---|---|---|---|---|
| 4,841,235 A | * | 6/1989 | Hastings et al. | 324/117 R |
| 5,523,677 A | * | 6/1996 | Kawakami et al. | 324/117 R |
| 5,548,208 A | * | 8/1996 | Lust | 324/117 H |
| 6,184,679 B1 | * | 2/2001 | Popovic et al. | 324/251 |
| 6,411,078 B1 | * | 6/2002 | Nakagawa et al. | 324/117 H |
| 6,441,605 B1 | * | 8/2002 | Baurand et al. | 324/127 |
| 6,788,046 B2 | * | 9/2004 | Lenhard et al. | 324/117 R |
| 6,989,666 B2 | * | 1/2006 | Kawase | 324/117 R |
| 7,250,749 B2 | * | 7/2007 | Itoh | 324/117 H |
| 7,397,233 B2 | * | 7/2008 | Sorensen | 324/76.11 |
| 8,080,994 B2 | * | 12/2011 | Taylor et al. | 324/252 |
| 8,115,479 B2 | * | 2/2012 | Aimuta et al. | 324/207.25 |

(Continued)

FOREIGN PATENT DOCUMENTS

| | | |
|---|---|---|
| DE | 43 00 605 | 7/1994 |
| DE | 198 19 470 | 7/1999 |

(Continued)

*Primary Examiner* — Joshua Benitez-Rosario
(74) *Attorney, Agent, or Firm* — DLA Piper LLP (US)

(57) ABSTRACT

An arrangement for potential-free measurement of current flowing in two primary conductors arranged in parallel in opposite directions of each other. The magnetic differential field is detected by a differential field sensor. The primary conductors and the differential field sensor are disposed between two metal shield plates made of a highly permeable material. Each shield plate has a web and the webs extend on both sides of the arrangement of the primary conductors in parallel to the arrangement. At least one shield plate has a U-shape in cross-sectional planes having one pair of limbs that extend at a right angle in a longitudinal direction to the U-shaped cross-sectional planes. At least one limb of one shield plate is aligned toward the other shield plates on one of the limbs while leaving an air gap.

18 Claims, 3 Drawing Sheets

(56) References Cited

U.S. PATENT DOCUMENTS

| | | | |
|---|---|---|---|
| 8,203,328 B2 * | 6/2012 | Bose et al. | 324/117 H |
| 2004/0080307 A1 * | 4/2004 | Ohtsuka | 324/117 H |
| 2006/0290340 A1 * | 12/2006 | Shapiro | 324/117 H |
| 2007/0090826 A1 * | 4/2007 | Itoh | 324/117 R |
| 2007/0279053 A1 * | 12/2007 | Taylor et al. | 324/252 |
| 2010/0259247 A1 * | 10/2010 | Ibuki et al. | 324/127 |
| 2010/0264905 A1 * | 10/2010 | Schmitt | 324/126 |
| 2010/0301852 A1 * | 12/2010 | Teppan et al. | 324/253 |

FOREIGN PATENT DOCUMENTS

| | | |
|---|---|---|
| DE | 200 17 512 | 2/2001 |
| EP | 0874244 | 10/1998 |
| EP | 1746426 | 1/2007 |
| WO | WO 00/11482 | 3/2000 |
| WO | WO 02/06844 | 1/2002 |

* cited by examiner

ARRANGEMENT FOR THE POTENTIAL-FREE MEASUREMENT OF CURRENTS

BACKGROUND OF THE INVENTION (1) Field of the Invention

The invention relates to an arrangement for the potential-free measurement of currents according to the preamble of claim 1.

(2) Description of Related Art

Prior art arrangements of this type measure currents by detecting a magnetic differential field, or a magnetic field gradient, respectively, generated by a current in a substantially U-shaped conductor unit the limbs of which may be referred to as primary conductors (WO 00/11482, DE 4300605 C2, U.S. Pat. No. 5,548,208).

The magnetic differential field, or the magnetic field gradient, respectively, penetrates a differential field sensor, or a gradiometer, respectively, which generates a signal voltage corresponding to the magnetic differential field, or the magnetic field gradient, respectively, without being galvanically connected with the primary circuit. Thereby, a measuring system is desired without any elaborate magnetic flow conduction while the influence of magnetic interference fields is nonetheless minimized.

Sensors based on magneto resistive effects such as the anisotropic magneto resistive effect (AMR) or the gigantic magneto resistive effect (GMR) may be used in particular as suitable differential field sensors. Such sensor systems on the basis of the colossal magneto resistive effect (CMR) or of the tunnel magneto resistive effect (TMR) are conceivable as well.

In the case of arrangements for the potential-free measurements of currents of the kind referred to in the beginning, it is the task as mentioned before to reduce a sensibility vis-à-vis external magnetic interference fields which may disturb the detection of the magnetic differential field, or the field gradient, respectively, relevant for the measurement. The external magnetic fields may, inter alia, be caused by eddy currents which, on their part, are induced in adjoining metal parts by the magnetic field of the current to be measured, referred to as primary current. In order to reduce the frequency-depending measuring errors caused thereby, it has already been known in an arrangement of the kind referred to in the beginning to adjust the cross-sectional area and the form as well as the material selection of the primary conductors and their distance from particularly shaped neighboring metal parts, if any, and the magnetic field sensitive measuring devices, particularly sensors, so that the influences of different electro-dynamic effects, particularly of the induction of eddy currents in the neighboring metal parts, largely compensate each other (DE 19819470 A1, particularly FIG. 4). In detail, an arrangement of this kind is realized by a conductor unit made in U-shape on which a dielectric plate is fastened which carries a magnetic field measuring device and causes a galvanic separation. Above and below this arrangement, the above-referenced neighboring metal parts, particularly plates, are disposed, spaced in predetermined order.

BRIEF SUMMARY OF THE INVENTION

It is the object of the present invention to further reduce, in an arrangement for potential-free measurement of currents of the kind referred to in the beginning, the influence of external interference fields on the detection of the magnetic differential field, or the field gradient, respectively, of two substantially parallel primary conductors in a technically less sophisticated way and to obtain, by the means to be used, an additional technical benefit.

This task is solved by the features referred to in claim 1.

By means of the two metal parts shaped, according to the invention, as shield plates made of highly permeable material at least one of which plates being configured substantially U-shaped in cross-sectional planes, having one pair of limbs each which extend at a right angle in a longitudinal direction to the U-shaped cross-sectional planes wherein the two shield plates are disposed relative to each other such that the at least one limb pair of one of the two shield plates is aligned toward the other of the two shield plates while leaving an air gap each on one of the two limbs and wherein the primary conductors extend in the longitudinal direction of the limb, a very good shielding of the differential field sensor which is disposed, as are the primary conductors, within the space enclosed by the shield plates, is obtained against the external magnetic interference fields. Nonetheless, the magnetic field gradients originating from the primary conductors detected by the differential field sensor are not too much attenuated since the two shield plates do not form a completely closed magnetic circle about the primary conductors. The dimensioning of the shield plates which are formed and disposed according to the features of the claim may be obtained by simple trials or simulation calculations of the field configuration, particularly at the site of the differential field sensors.

As an additional benefit, in this connection, the measuring sensibility, or the measuring range, respectively, of the arrangement for the potential-free measurement of currents can be set, namely by variation of the air gap and/or the dimensions, particularly of the thickness of the shield plates.

In an effective variant of the arrangement of the invention, the two shield plates are shaped as having one pair of limbs each between which one of the webs each is disposed, and these two shield plates are arranged relative to each other in a way so that the two limb pairs of the shield plates are aligned toward each other while leaving one air gap each.

Based on the arrangement according to the invention and the variant thereof, the measuring task can be solved which is to measure a current through a U-shaped conductor unit according to claim 8 which flows, in two parallel limbs of the U-shaped conductor unit constituting primary conductors, in an opposite direction. The arrangement is particularly suited to measure large currents, for instance in a current measuring range of 2000 A while the measurement is not invalidated by magnetic interference fields which would otherwise come up in case of high primary currents.

It is, however, also possible that, according to claim 9, a second measuring task may be solved wherein a difference of two currents in two primary conductors has to be measured which constitute an outgoing (to) conductor and a return (fro) conductor of an electric consuming device in order to detect possible fault currents in the load, a consuming device or a set-up. In the case of the last-mentioned measuring task, shielding of external magnetic interferences is of particular significance since the magnetic field gradient resulting from the primary currents in the outgoing and return conductor is small.

In both of the above-referenced configurations of the primary conductors, they are substantially arranged, according to claim 3, between the limbs of one of the two shield plates resulting in a compact structure of the total measuring arrangement together with the differential field sensor the effective sensor plane of which is disposed, according to claim 4, preferably outside of the limbs of the shield plate between which the primary conductors are arranged. In this way, a high measuring sensibility can be obtained without substantially attenuating the magnetic difference field, or the field gradient, respectively, covered by the differential field sensor.

In a basic arrangement for the potential-free measurement of currents according to claim 5, the limbs of the two shield plates are equally long and the two shield plates are disposed symmetrically relative to an effective sensor plane.

The effective sensor plane is that plane of the differential field sensor in which the transformation of the difference field, or the magnetic field gradient, respectively, into a signal voltage takes place, that is for instance the magneto-resistive layer and not the substrate, or the carrier, of the sensor.

While in a modified and space-optimized total arrangement according to claim 6 the limbs of one of the shield plates each are equally long, the limb pairs of the shield plates have a different length so that the one shield plate has two equally long shorter limbs while the other shield plate has two equally long longer limbs. The primary conductors are substantially arranged between the longer limbs of the corresponding shield plate. This means that the air gaps are arranged non-symmetrically relative to a middle plane disposed in the middle of the arrangement of the two shield plates in parallel to the webs thereof. At the same time, the effective sensor plane is displaced relative to the middle plane referred to. The webs are preferably plane sections of the shield plates which connect limbs bent to form right angles at them.

Both in case of the basic arrangement and in case of the modified arrangement, the shield plates extend in the longitudinal direction of their limbs substantially over the differential field sensor in order to shield it against external magnetic interference fields. The longitudinal direction of the limbs of the shield plates extends in parallel to the direction of the current in the primary conductors.

In that case in which the two primary conductors constitute component parts of a U-shaped conductor unit, the shield plates extend, for a good shielding of the differential field sensor against external magnetic interference fields, according to claim 10, suitably in the longitudinal direction of the limbs thereof substantially over the length of the limbs of the U-shaped conductor unit.

Typically, the shield plates of highly variable material may consist, according to claim 11, of mumetal or may, according to claim 12, be electric sheets in order to practically exclude, if the limbs of the shield plates are correctly positioned, the formation of any magnetic field gradient by external homogeneous or inhomogeneous magnetic fields, substantially independently from the interference direction of the interference fields from outside onto the two shield plates. This means also that an inhomogeneous magnetic field originating from a conductor which is a neighbor outside of the arrangement of the two shield plates does not have an interfering impact on the differential field sensor within the shield plate arrangement.

By positioning the air gaps and/or altering the dimensions of the shield plates, as referred to above, it is possible to readjust, or alter, the measuring sensitivity, or the measuring range, respectively, of the arrangement for the potential-free measurement of currents. An additional, particularly practicable possibility for the adjustment of the measuring range consists in that, according to claim 13, at least one soft-magnetic insert part shaped as an insert pin or insert strip is disposed within the two shield plates in order to influence the magnetic difference field in the effective sensor plane.

To this end, the at least one insert part may be arranged, according to claim 14, between the effective sensor plane and the primary conductors. In particular, two primary conductors which are arranged outside of the magnetic field sensitive range of the differential field sensor may attenuate the magnetic field decisive for the current measurement as compared to an arrangement without insert parts. If, however, at least one insert part is arranged in the magnetic field sensitive range of the differential field sensor, between the latter and the two primary conductors, the measuring sensitivity will be enhanced. In this way, a basic arrangement comprising the differential field sensor and the primary conductors within the shield plates may be adapted, by additional insert parts which are simple to handle to desired different measuring ranges, for instance for measuring ranges from 50 to 2000 A. In addition to the positioning of the insert part, or the insert parts, respectively, the position of the air gaps should, as a rule, be modified. To this end, the air gaps can, according to claim 18, be adjusted.

Typical variants of the positioning of the insert parts are described in claims 15 through 17.

In the case of an arrangement of at least one insert part either between the effective sensor plane and the primary conductors or between the effective sensor plane and the nearest neighboring shield plate, the impact of the at least one insert part on the measuring sensitivity, or the measuring range, respectively, is in general most significant.

By means of the at least one insert part, if necessary in connection with an adjustment of the air gap and with the basic set-up of the arrangement of the shield plates, of the primary conductors and of the differential field sensor remaining as it is, it is possible to establish in the effective sensor plane a measuring range of for instance between 50 through 2000 A.

Exemplified embodiments of the arrangement for the potential free measurement of currents will be explained in the following based on five figures from which further details, particularly as concerns the spatial-geometric disposal of the components of the arrangement, will be obtained.

Figure 1:
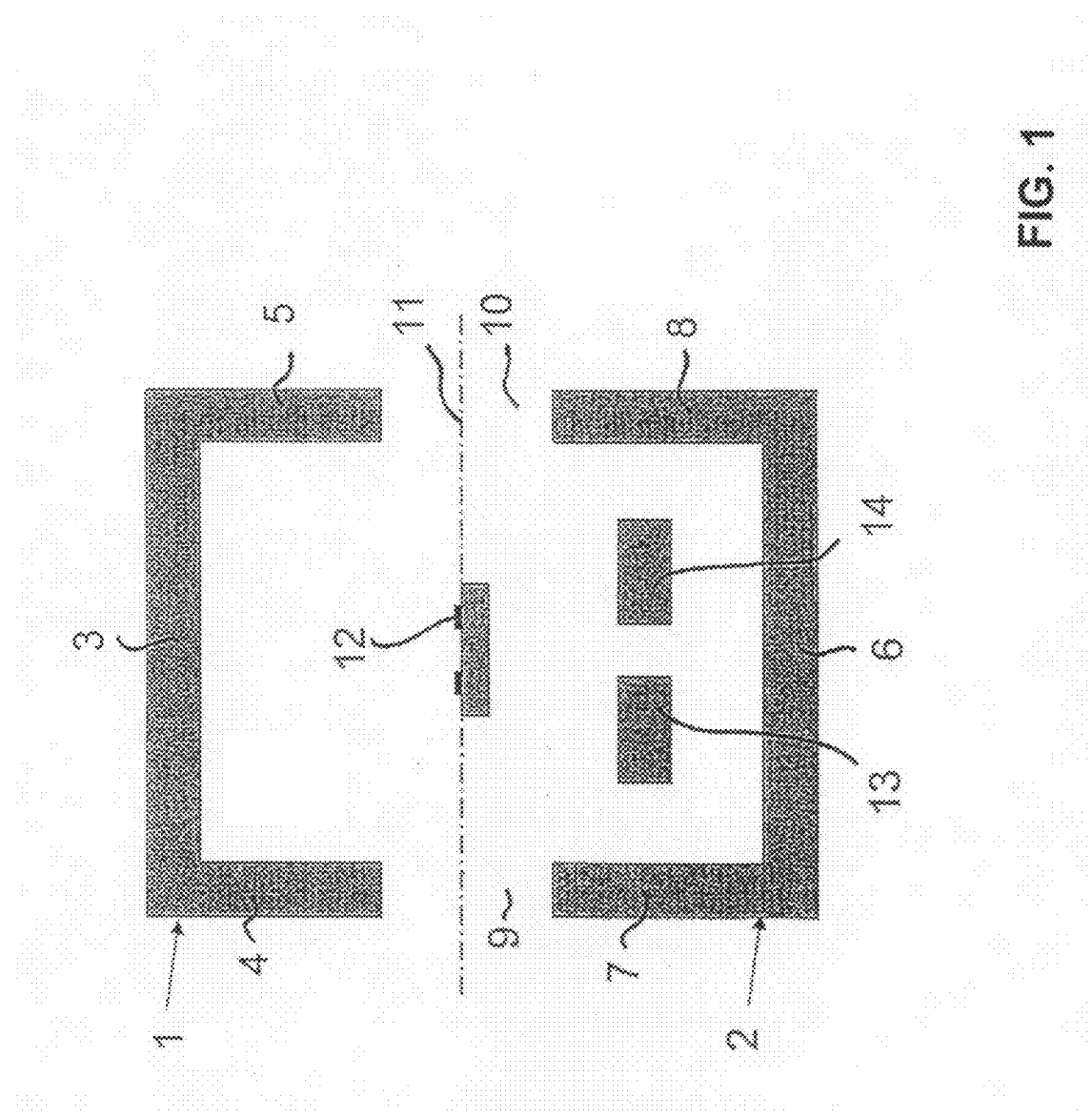
FIG. 1 is a basic arrangement in a cross section.

In the basis arrangement according to FIG. 1, a first shield plate 1 and a second shield plate 2 made of highly permeable material are bent in an approximate U-shape. Subsequently, from an approximately plane web 3 of the first shield plate 1, there extend two limbs 4, 5, and from a substantially plane web 6 of the second shield plate 2, there extend two limbs 7 and 8. The two shield plates 1, 2 are arranged relative to each other so that their limbs 4, 5, and 7, 8, respectively, are directed toward each other, i.e. are in alignment with one another, while one air gap 9 and 10, respectively, is left free. The disposal of the two shield plates 1, 2 is symmetrical relative to an effective sensor plane 11, in which there is an effective layer of a differential field sensor 12. The differential field sensor 12 may be secured, potential-free, by an insulating holder, not shown, relative to two primary conductors 13, 14.

The two primary conductors 13, 14, as shown in detail in FIG. 1, may be the limbs of a substantially U-shaped conductor unit which extend in the longitudinal direction (that is at right angles to the plane of the drawing) in parallel relative to the shield plates 2, 3 and the effective sensor plane 11. The extension of these limbs in the longitudinal direction and the expansion of the limb 4, 5, 7, 8 of the shield plates 1, 2 in the longitudinal direction as well are in this case substantially identical. The limbs, or primary conductors, respectively, 13, 14 are therefore encompassed between the shield plates 1, 2. The differential field sensor extends within this arrangement in the longitudinal direction at the maximum as far as do the limbs 4, 5, 7, 8 of the shield plates 1, 2.

In the case of this symmetrical arrangement of the shield plates 1, 2, the space between the limbs 7, 8 of the lower shield plate 2 is utilized by the integration of the primary conductors 13, 14 between the limbs while the inner space of the upper shield plate 1 between the limbs 4 and 5 remains free, that is, it is not used for the integration of components of the arrangement.

Figure 2:
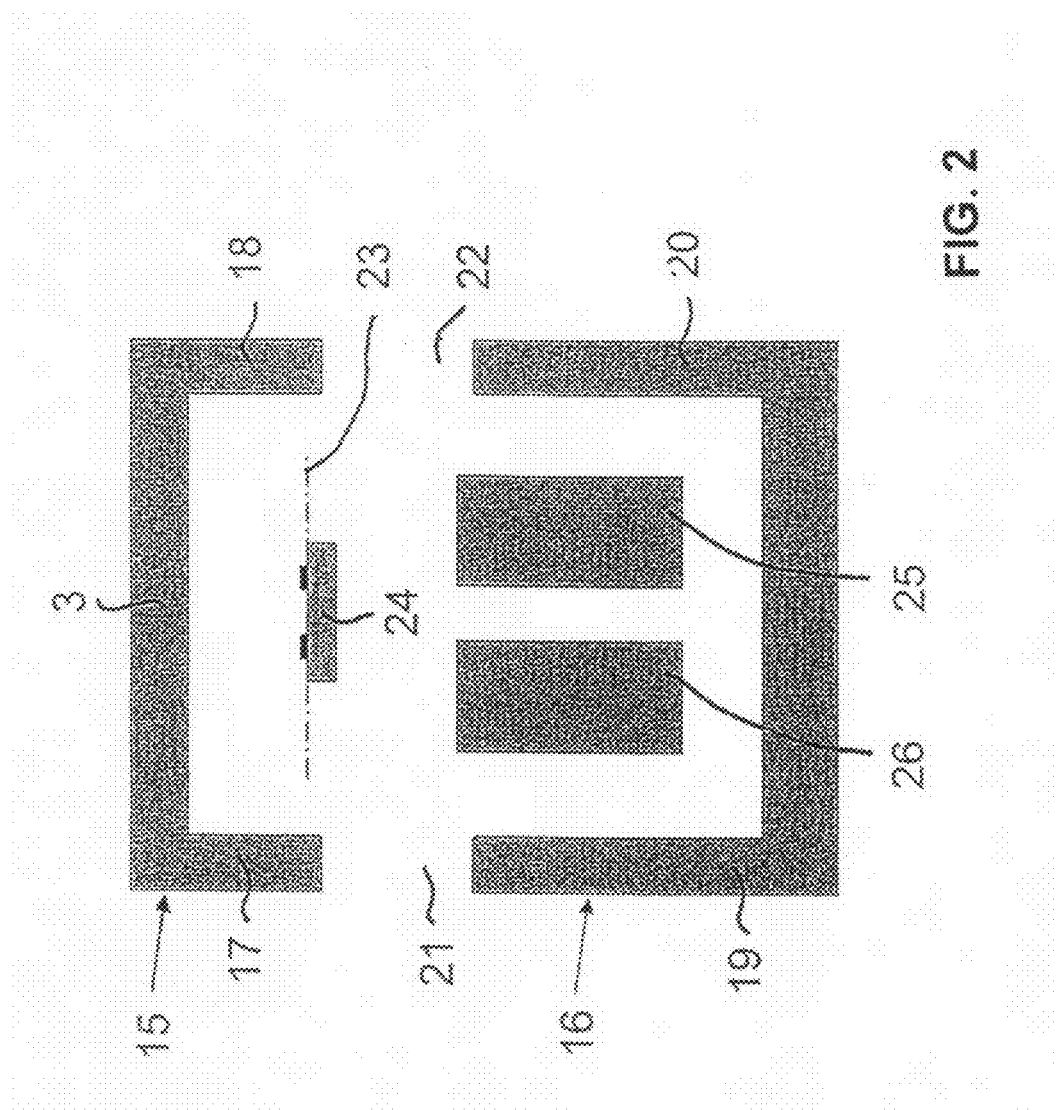
FIG. 2 is a modified arrangement, also in a cross section.

A first modified and in this way space-optimized arrangement is shown in FIG. 2. It differs from the symmetrical arrangement according to FIG. 1 in that a first shield plate 15 and a second shield plate 16 are differently designed so that limbs 17, 18 of the first shield plate while identical relative to each other are shorter than limbs 19, 20 of the second shield plate 16, while the length of the two limbs 19, 20 is identical. By the aligned arrangement of the limbs 17, 18 with the limbs 19, 20 which are basically positioned as in the basic arrangement according to FIG. 1, this has the result that air gaps 21, 22 between the limbs 17, 19, and 18, 20, respectively, are relatively higher in the present arrangement than in the arrangement according to FIG. 1. Similarly, the effective sensor plane 23 of the differential field sensor 24 is displaced upwardly.

DETAILED DESCRIPTION OF THE INVENTION

Both in the embodiment according to FIG. 1 and in the one according to FIG. 2, the sensor plane is disposed outside of the limbs 7, 8, or 19, 20, respectively of the second, lower, shield plate 2, or 16, respectively. The limbs 19, 20, again, encompass two primary conductors which may extend beyond these limbs.

The two primary conductors 25, 26, again, may be realized in the shape of a substantially U-shaped conductor unit.

In principle, however, the two primary conductors may also in all the embodiments of the arrangement displayed be separate outgoing and return conductors of an electric consuming device.

Figure 3:
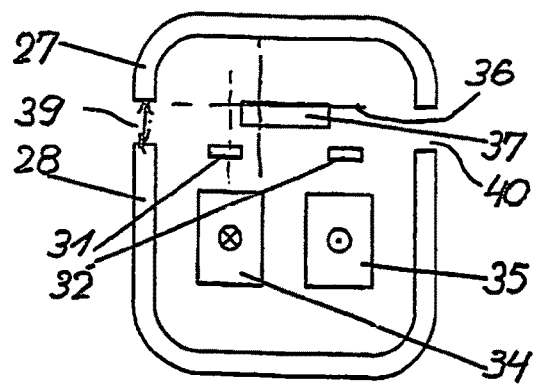
FIG. 3 is a second modified arrangement including insert parts, also in a cross section.
Figure 4:
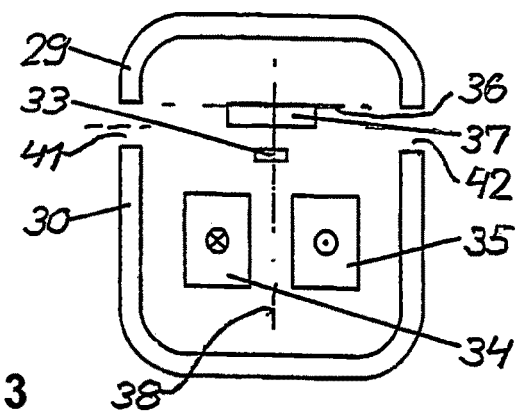
FIG. 4 is a third modified arrangement including one insert part, in a cross section.

In the embodiments according to FIGS. 3 and 4, examples are shown of the positioning of soft-magnetic insert parts in the spaces, enclosed by two shield plates 27, 28 in FIGS. 3, and 29, 30 in FIG. 4, respectively, of arrangements for the potential-free measurement of currents. The insert parts are designated by numerals 31-33. They extend in the longitudinal direction perpendicularly to the plane of the drawing, substantially over the same length as the shield plates 27-30.

More in detail, there is arranged, in the embodiment according to FIG. 3, an insert part 31, or 32, respectively, each between one of the two primary conductors 34, 35 and the effective sensor plane 36 of a differential field sensor 37.

Contrary thereto, in the embodiment according to FIG. 4, only the one insert part 33 is positioned symmetrically to a middle plane 38 vertical in FIG. 4.

In the two embodiments according to FIGS. 3 and 4, the measuring sensitivity, or the measuring range, respectively, may be adjusted by the insert parts 31-33, and regularly also by the position of the air gaps 39, 40 and 41, 42, respectively.

The embodiment according to FIG. 3 leads to an attenuation of the magnetic differential field, or the field gradient, respectively, in the effective sensor plane 36, while the embodiment according to FIG. 4, leads to a gain of the magnetic differential field, or the field gradient, respectively, so that the measuring sensitivity will be enhanced and the measuring range becomes smaller.

The insert parts may in particular consist of mumetal.

Figure 5:
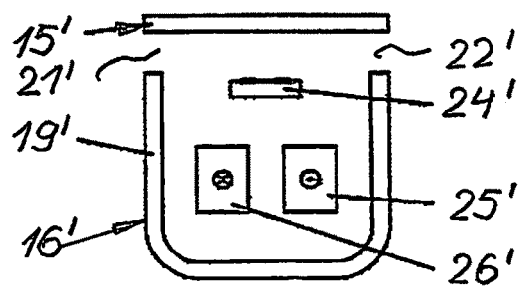
FIG. 5 is a fourth modified arrangement without any insert part, in a cross section.

The fourth modified, simplified, arrangement shown in FIG. 5, is like for instance the first modified arrangement, unsymmetrical relative to an horizontal plane, not shown in the drawing, particularly the effective sensor plane and actually still further unsymmetrical than the modified arrangement according to FIG. 2 since only the second shield plate 16' is provided with two limbs 19', 20'. As compared thereto, the first shield plate 15' is designed for easy production only in plane shape, quasi as a web without a limb. Air gaps 21', 22' are provided in this arrangement between one of the limbs 19', 20', each, of the second shield plate 16', on one hand, and the first shield plate 15', on the other, that is, they are provided at the free ends of the limbs 19', 20'.

The limbs 19', 20' in this arrangement, too, encompass two primary conductors 25', 26' parallel relative to each other in such a way that above the primary conductors 25', 26', space is left for the differential field sensor 24'. The effective sensor plane, not shown in FIG. 5, is in this case disposed, protected, deeper than the ends of the limbs 19', 20'.

As concerns the adjustment of the measuring range described above, the embodiment according to FIG. 5 can be provided with one insert part or with two insert parts.

List of Reference Numerals
 1 $1^{st}$ Shield plate
 2 $2^{nd}$ Shield plate
 3 Web
 4 Limb
 5 Limb
 6 Web
 7 Limb
 8 Limb
 9 Air gap
 10 Air gap
 11 Effective sensor plane
 12 Differential field sensor
 13 Primary conductor
 14 Primary conductor
 15, 15' $1^{st}$ Shield plate
 16, 16' $2^{nd}$ Shield plate
 17 Limb
 18 Limb
 19, 19' Limb
 20, 20' Limb
 21, 21' Air gap
 22, 22' Air gap
 23 Effective sensor plane
 24, 24' Differential field sensor
 25, 25' Primary conductor
 26, 26' Primary conductor
 27 $1^{st}$ Shield plate
 28 $2^{nd}$ Shield plate
 29 $1^{st}$ Shield plate
 30 $2^{nd}$ Shield plate
 31 Insert part
 32 Insert part
 33 Insert part
 34 Primary conductor
 35 Primary conductor
 36 Effective sensor plane
 37 Differential field sensor
 38 Vertical middle plane 39 Air gap
40 Air gap
41 Air gap
42 Air gap

The invention claimed is:

1. Arrangement for a potential-free measurement of currents flowing in two primary conductors arranged substantially in parallel, in opposite directions of each other, by detecting the magnetic differential field by means of a differential field sensor, wherein for reducing measuring errors, said primary conductors and said differential field sensor are disposed between two metal parts,
characterized in
that the two metal parts are configured as shield plates each having a web,
that said webs extend on both sides of the arrangement of the primary conductors substantially in a direction parallel to the arrangement of the primary conductors,
that at least one of said shield plates is configured in a U-shape in cross-sectional planes having a pair of limbs each of which extend in a longitudinal direction that is at a right angle to the U-shaped cross-sectional planes,
that said two shield plates are disposed relative to each other such that the at least one limb pair of one of said two shield plates is aligned towards the other of said two shield plates while leaving one air gap each on one of said two limbs, and
that said primary conductors extend in the longitudinal direction.

2. Arrangement according to claim 1,
characterized in
that said two shield plates are configured with one limb pair each between which one of said webs each is disposed, and
that said shield plates are arranged relative to each other such that said two limb pairs of said shield plates are aligned toward each other while leaving one air gap each between two of said limbs.

3. Arrangement according to claim 1,
characterized in
that said primary conductors are substantially arranged between said limbs of one of said two shield plates.

4. Arrangement according to claim 1,
characterized in
that an effective sensor plane is disposed outside of said limbs of said shield plate between which limbs said primary conductors are arranged.

5. Arrangement according to claim 1,
characterized in
that said limbs of said two shield plates are equally long and
that said two shield plates are symmetrically disposed relative to an effective sensor plane.

6. Arrangement according to one of the claims 1-4,
characterized in
that said limbs of one of said shield plates each are equally long,
that said limb pairs of said shield plates have different lengths, and
that said primary conductors are substantially arranged between said longer limbs of one of said two shield plates.

7. Arrangement according to one of the claims 1-4,
characterized in
that said shield plates extend in the longitudinal direction of the limbs thereof substantially above said differential field sensor.

8. Arrangement according to one of the claims 1-4,
characterized in
that said two parallel primary conductors constitute limbs of a substantially U-shaped conductor unit.

9. Arrangement according to claim 8,
characterized in
that said shield plates extend in the longitudinal direction of their limbs substantially over the length of the limbs of said U-shaped conductor unit.

10. Arrangement according to one of the claims 1-4,
characterized in
that said two parallel primary conductors are an outgoing conductor and a return conductor of an electric consuming device.

11. Arrangement according to one of the claims 1-4,
characterized in
that said shield plates consist of mumetal.

12. Arrangement according to one of the claims 1-4,
characterized in
that said shield plates are electric sheets.

13. Arrangement according to claim 4,
characterized in
that for the establishment of the magnetic differential field in the effective sensor plane at least one soft magnetic insert part is used which is arranged within a space enclosed by the two shield plates.

14. Arrangement according to claim 13,
characterized in
that the at least one insert part is disposed between said effective sensor plane and said primary conductors.

15. Arrangement according to claim 14,
characterized in
that between each of said primary conductors and said effective sensor plane one insert part each is disposed.

16. Arrangement according to claim 14,
characterized in
that between said two primary conductors and the effective sensor plane only one insert part is disposed symmetrically to a middle plane between said primary conductors.

17. Arrangement according to claim 14,
characterized in
that the at least one insert part is disposed between said effective sensor plane and the nearest neighboring shield plate.

18. Arrangement according to one of the claims 1-4,
characterized in
that said air gaps are adjustable on or between, respectively, said limbs of said shield plates.

* * * * *